(12) United States Patent
Winterer

(10) Patent No.: US 6,393,922 B1
(45) Date of Patent: May 28, 2002

(54) PRESSURE SENSOR COMPONENT WITH HOSE CONNECTION

(75) Inventor: Jürgen Winterer, Nürnberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/363,264

(22) Filed: Jul. 29, 1999

Related U.S. Application Data

(63) Continuation of application No. PCT/DE98/00187, filed on Jan. 21, 1998.

(30) Foreign Application Priority Data

Jan. 29, 1997 (DE) .......................... 197 03 206

(51) Int. Cl.$^7$ ............................. G01L 9/00; G01L 7/00
(52) U.S. Cl. ............................ 73/754; 73/756
(58) Field of Search .................. 73/715, 721, 727, 73/756, 726, 754; 251/417, 701, 687, 420, 415, 419

(56) References Cited

U.S. PATENT DOCUMENTS

| | | | |
|---|---|---|---|
| 3,662,312 A | * 5/1972 | Thorp et al. | .................... 338/4 |
| 4,838,089 A | 6/1989 | Okada et al. | .................. 73/727 |
| 5,436,491 A | 7/1995 | Hase et al. | .................. 257/417 |
| 5,711,302 A | * 1/1998 | Lampropoulos et al. | .... 128/672 |
| 6,047,604 A | * 4/2000 | Auburger et al. | ............. 73/756 |

FOREIGN PATENT DOCUMENTS

| | | |
|---|---|---|
| DE | 39 37 522 A1 | 5/1991 |
| DE | 4400439 A1 | 7/1994 |
| DE | 431312 A1 | 12/1994 |
| DE | 4203832 C2 | 6/1996 |
| EP | 0497534 A2 | 8/1992 |

OTHER PUBLICATIONS

Japanese Patent Abstract No. 6–232423 (Ishihashi), dated Aug. 19, 1994.
Japanese Patent Abstract No. 4–155970 (Tanaka), dated May 28, 1992.
"Trends bei Silizium–Druck–Sensoren", Fachbeilage Mikroperipherik, May 1987, pp. 3–7, pertains to trends in silicon pressure sensor
Published International Application No. 96/24424 (Eimer et al.), dated Aug. 15, 1996.
Japanese Patent Abstract No. 6–120527 (Kawahira), dated Apr. 28, 1994.
Japanese Patent Abstract No. 56–148870 (Kimijima), dated Nov. 18, 1981.

* cited by examiner

Primary Examiner—Benjamin R. Fuller
Assistant Examiner—Abdullahi Aw-Musse
(74) Attorney, Agent, or Firm—Herbert L. Lerner; Laurence A. Greenberg; Werner H. Stemer

(57) ABSTRACT

The invention relates to a pressure sensor component comprising a base body and a pressure connection element. The base body comprises a chip carrier, onto which a semiconductor chip with an integrated pressure sensor is mounted. Contact is made with the semiconductor chip by means of connection, which are routed laterally out from the base body. The base body is open on one side, and the opening is bounded by side parts of the chip carrier. The pressure connection element is placed onto the upper end regions of the side parts. The invention is distinguished by the fact that the filler, with which the inner space of the base body is filled and the semiconductor chip is covered, is simultaneously used to connect and seal the pressure connection element and the base body. The ends of the pressure connection element are preferably configured in such a way that the filler is drawn by capillary forces into the interspace between side parts and pressure connection element. The pressure connection element is particularly preferably configured in such a way that hoses of different diameter can be attached.

10 Claims, 2 Drawing Sheets

PRESSURE SENSOR COMPONENT WITH HOSE CONNECTION

CROSS-REFERENCE TO RELATED APPLICATION

This is a continuation of copending International Application PCT/DE98/00187, filed Jan. 21, 1998, which designated the United States.

BACKGROUND OF THE INVENTION

Field of the Invention

The invention relates to a pressure sensor component with a pressure connection element, in particular with a hose connection element, which can be mounted on the component-mounting top side of a printed circuit board. Such components are preferably surface-mounted (so-called SMD; SMD=surface mounted design) for space-saving reasons. The pressure measurement is usually carried out in accordance with the piezoresistive principle. Alternatively, it is possible to work with capacitive measurement principles. A semiconductor chip generally composed of silicon is used, as a rule, as the pressure sensor. In the case of piezoresistive measurement, the chip surface has arranged on it a thin silicon diaphragm electrically coupled to pressure-dependent resistors which are likewise formed in the silicon substrate and are connected in a bridge circuit. The semiconductor chip likewise comprises a circuit, assigned to the sensor, for amplification and correction of the signals and for trimming and for compensation of the sensor.

In order to measure the pressure, it is necessary to establish contact between the medium to be measured and the pressure sensor, that is to say the medium to be measured must be brought up to the sensor or the prevailing pressure must be transmitted to the sensor. Therefore, the pressure sensor is disposed in a housing which is open on one side. The pressure-sensitive surface of the sensor can thus make contact directly or indirectly with the medium to be measured. In order to prevent damage to the pressure sensor by the medium, it is customary to cover the surface of the semiconductor chip with a flowable filler, generally a plastic gel. The filler is chosen such that it passes on the pressure uncorrupted to the sensor.

If the medium to be measured is the medium which surrounds the pressure sensor component, the open pressure sensor component as such can be used. If the medium to be measured is not the same as the surrounding medium, the medium to be measured must be brought up to the sensor separately from the surrounding medium. For this purpose, use is usually made of a hose or tube system connected to the sensor component.

It has heretofore been customary in such cases to use pressure sensors embedded in a special housing with a hose connection. As a rule, these housings are considerably larger than the corresponding housings for the same sensor without a hose connection. This is disadvantageous both from cost standpoints and with regard to the subsequent application of the components. Moreover, the pressure sensor components with a hose connection obtainable heretofore have a defined connection diameter, which is fixed from the outset, with the result that the user of the pressure sensor is not left with any choice options in respect of the hose connection that is used.

A further disadvantage of the prior art pressure sensor components with a hose connection resides in the production of the components. The hose connection is fitted only after the open pressure sensor has been fully completed and the semiconductor chip has been covered with the filler. The hose connection is then bonded onto the pressure sensor component. In other words, an additional step, namely the permanent bonding of the hose connection, is necessary for the production process. In addition, it is necessary to test the adhesive bond in terms of its tightness. These additional steps are time and cost-intensive.

German published patent application DE 43 17 312 describes a pressure sensor with a pressure chamber arranged in a plastic housing. The pressure chamber has a tube connector which engages in a connection tube of a housing cover. It is described that at low pressures it may suffice to effect sealing between tube connector and connection tube with potting compound which is used to cover ceramic chip capacitors.

SUMMARY OF THE INVENTION

It is accordingly an object of the invention to provide a pressure sensor component with a hose connection, which overcomes the above-mentioned disadvantages of the heretoforeknown devices and methods of this general type and which can be produced simply and cost-effectively. At the same time, the size of the housing should be kept as small as possible and, expediently, it should be possible to use the same base housing form as for a corresponding open sensor component without a hose connection. In addition, the pressure sensor component should be suitable for the connection of hoses of different diameter.

With the foregoing and other objects in view there is provided, in accordance with the invention, a pressure sensor component for mounting on a component-mounting surface of a printed circuit board, the component comprising:
  a base body formed with a chip carrier and a semiconductor chip mounted on the chip carrier;
  a flowable filler completely covering the base body;
  a plurality of electrical connections to be routed out from the base body;
  a tubular pressure connection element having an end fastened on the base body, the flowable filler filling interspaces formed between the end of the pressure connection element and the base body at least partially and sealing the pressure connection element gastightly against the base body.

In accordance with an added feature of the invention, the pressure connection element is fastened on the base body by an attachment selected from the group consisting of adhesive bonding, welding, and clamping.

In other words, the pressure sensor component according to the invention comprises a base body, which, in principle, may correspond to a customarily used open pressure sensor component, that is to say to a component without a hose attachment, and a pressure connection element matching the base body.

The distinctive feature of the invention is the fact that the base body and the pressure connection element are sealed with respect to one another with the flowable filler which is likewise used to fill the chip carrier and to cover the semiconductor chip. The base body is preferably configured to be open on one side and encompasses the semiconductor chip mounted on the chip carrier and connections which are contact-connected to said chip. The pressure connection element is advantageously placed onto the base body and encloses the opening in the base body in which the semiconductor chip is situated. This has the advantage that the filling of the chip carrier and hence the covering of the semiconductor chip and the sealing between base body and pressure connection element can be carried out together.

The flowable filler used is one which is sufficiently elastic to transmit pressures to the pressure sensor without corrupting the measurement results. With respect to the media usually to be measured, the filler should be largely chemically inert and be simple to handle. The filler is preferably a plastic gel, in particular a silicone-based gel.

As already mentioned, the base body of the pressure sensor component can, in principle, have any form and configuration which is usually used in the case of pressure sensor components which can be mounted on printed circuit boards. The base body expediently comprises a chip carrier made of plastic, in particular made of thermoplastic, which has an essentially planar chip carrier area on which the semiconductor chip with an integrated pressure sensor is arranged. Embedded in the plastic composition are a plurality of connections which project laterally from the chip carrier. The semiconductor chip and connections are contact-connected to one another in a customary manner for example by bonding wires. Alternatively, the chip can be arranged on a metallic lead frame having integrated connections. The chip carrier preferably has, at its edges, a side wall which has a height projecting above the chip surface and encloses the chip carrier. This side wall bounds the opening in the base body through which the medium to be measured is fed to the pressure sensor for the pressure measurement. The side wall of the base body expediently terminates in planar fashion at its upper end. The pressure connection element is placed onto this side wall.

The pressure connection element according to the invention is configured in such a way that its end region which bears on the side wall of the base body is forked. In other words, that end of the outer wall of the pressure connection element which faces the base body engages about the upper end region of the side wall. One end or partial region of that end of the outer wall of the pressure connection element which faces the base body in this case runs along the outer side of the side wall of the base body; another end or partial region of that end of the outer wall of the pressure connection element which faces the base body runs along the inner side of the side wall of the base body.

In order to achieve good sealing between the base body and the pressure connection element, the interspace situated between that end of the pressure connection element which faces the base body and the end region of the side wall of the base body, which end region faces the pressure connection element, is filled preferably as far as possible completely with the flowable filler, thereby forming gastight sealing between base body and pressure connection element.

In a particularly expedient manner, the interspace is filled at the same time as the semiconductor chip is covered. For this purpose, after the pressure connection element has been emplaced and fastened on the base body, the flowable filler is introduced through the opening in the pressure connection element into the base body cavity. The filling height and the length of the inner end regions of the pressure connection element are in this case coordinated with one another in such a way that the filler is drawn by capillary forces into the interspace between pressure connection element and side parts of the base body. Therefore, only one filling operation is necessary in order to provide the inner space of the base body with filler and to seal the base body and pressure connection element with respect to one another. The pressure sensor components according to the invention can therefore be produced extraordinarily simply and cost-effectively.

In accordance with an additional feature of the invention, the base body has a side wall encompassing the chip carrier and the semiconductor chip and forming an end region projecting towards the pressure connection element, the end of the pressure connection element engaging on both sides about the end region of the side wall, and wherein the base body and the pressure connection element are sealed against one another with the flowable filler.

In accordance with another feature of the invention, the side wall is formed with a flow stop edge for the filler, and the end of the pressure connection element facing the base body has an inner wall extending along an inside of the side wall of the base body for covering the flow stop edge peripherally inside the inner wall.

In order to produce open pressure sensor components, chip carriers with a peripheral flow stop edge along the inner side of the side wall of the base body are preferably used. The effect of this flow stop edge is that during the filling-in process, the filler does not penetrate beyond this edge into regions of the base body which ought not to be contaminated by the filler. Base bodies of this type can also be used within the scope of the invention. In order to ensure that the interspace between the end region of the side wall of the base body and the end of the emplaced pressure connection element is sufficiently filled, that end region of the pressure connection element which runs along the inner wall of the base body side parts is designed with a length such that it projects above the flow stop edge and covers the latter. In this way, capillary forces which draw the filler into the interspace between pressure connection element and base body side wall can also become effective in the region of the flow stop edge. With appropriate matching of the pressure connection element, then, it is also possible to use the customary open pressure sensor components with flow stop edge unchanged for the inventive pressure sensor components with connection.

In accordance with a further feature of the invention, the pressure connection element is formed with at least one fastening lug adapted to engage in an associated fastening cutout or opening formed in the base body.

In accordance with an alternative feature of the invention, the base body has at least one fastening lug formed thereon adapted to engage in an associated fastening recess formed in the pressure connection element.

The pressure connection element can be fastened to the base body particularly securely if two or more fastening lugs are formed in the pressure connection element, which lugs can latch into corresponding fastening openings or fastening cutouts in the base body. If only two fastening lugs are used, they are preferably situated on opposite sides of the pressure connection element. The fastening lugs are preferably formed in the region of the outer ends of the pressure connection element which run along the outer side wall of the base body in the assembled state. The fastening lugs particularly preferably project in the direction of the base body at the end-side end region of the outer ends of the pressure connection element. Alternatively, it is likewise possible, of course, to fit the fastening lugs in the base body and the associated fastening openings or cutouts in the pressure connection element.

In order to facilitate the engagement of the fastening lugs in the associated fastening openings or cutouts, the fastening lugs may be beveled or rounded in their edge region.

In accordance with again an added feature of the invention, the pressure connection element is formed with a conical connector for attachment of hoses of respectively different diameters.

The pressure connection element according to the invention is preferably adapted for the connection of a hose through which the medium to be measured can be fed to the pressure sensor in the base body. In order to enable the use of different hose diameters, it is possible either to use sets of pressure connection elements which differ only in respect of the hose diameter to be used. Preferably, however, a pressure connection element is used which is suitable for fitting hoses having different diameters. A pressure connection element having a conically inleading connector may be mentioned by way of example, onto which connector hoses having different diameters can be pulled. The suitable hose diameter can then be chosen in accordance with the respective application.

In accordance with a concomitant feature of the invention, the flowable filler is a gel, such as a silicone resin-based gel.

Other features which are considered as characteristic for the invention are set forth in the appended claims.

Although the invention is illustrated and described herein as embodied in a pressure sensor component with hose connection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
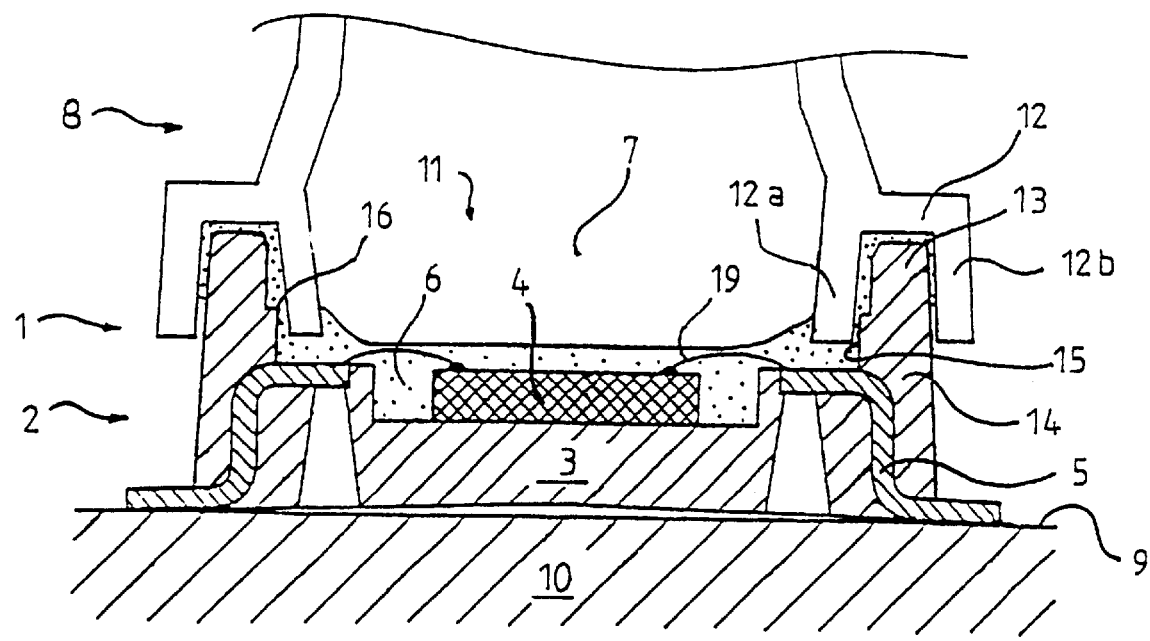
FIG. 1 is a diagrammatic sectional view of a pressure sensor component according to the invention.

Referring now to the figures of the drawing in detail and first, particularly, to FIG. 1 thereof, there is seen a pressure sensor component 1 which comprises a base body 2 and a pressure connection element 8. The base body 2 is disposed on a component-mounting side 9 of a printed circuit board 10. The base body 2 comprises a chip carrier 3 made of thermoplastic material. The chip carrier 3 has a central region onto which a semiconductor chip 4 is fitted. The semiconductor chip 4 has an integrated pressure sensor and an associated electric circuit. Neither the sensor itself nor the circuit are illustrated for the sake of clarity. The pressure sensor is a piezo sensor that operates according to the piezoresistive system. The semiconductor chip 4 is electrically conductively connected to metallic connections 5 or terminals 5 via bonding wires 19. The connections 5 are predominantly embedded in the chip carrier 3. Only their ends are routed out from the base body in opposite lower lateral regions.

Figure 2:
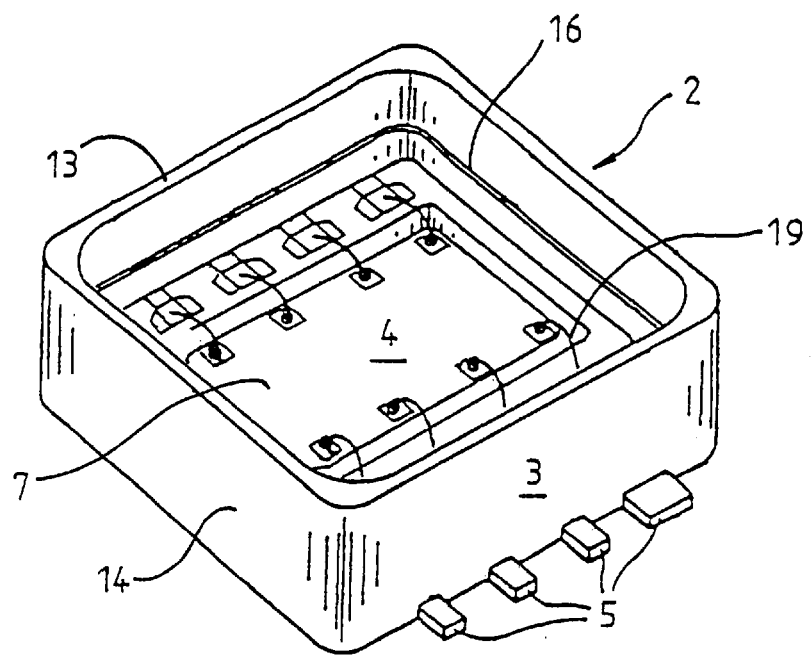
FIG. 2 is a perspective view of the base body of the pressure sensor component of FIG. 1.

With reference to FIG. 2, the pressure sensor component according to the invention has in each case four connections on two opposite sides of the chip carrier 3. In order to minimize the stresses between the base body 2 and the printed circuit board 10, only the outermost ends of the connections 5 bear on the printed circuit board 1. The roof-shaped configuration of the underside of the base body also serves to reduce stresses. Due to the distance between the central region of the base body 2 and the printed circuit board 10, flexure of the printed circuit board is transmitted to a lesser extent to the base body.

In its side 11 remote from the printed circuit board, the base body has a one-sided opening 7, which is bounded by the side parts (side wall) 14 of the base body 2. The medium to be measured is fed to the pressure sensor through this opening 7. For protection against this medium, the inner space of the opening 7 of the base body is partially filled with a flowable filler 6, in particular with a silicone-based gel. The gel completely covers semiconductor chip 4, bonding wires 19 and the part of the connections 5 which is situated in the inner space. In addition, the gel virtually completely fills the interspace between the upper end regions 13 of the side parts 14 and the pressure connection element 8 bearing on the side parts.

The pressure connection element 8 completely encloses the opening 7 in the base body 2. The end 12 of the pressure connection element 8 facing the base body 2 is forked, thereby forming an inner wall 12a and an outer wall 12b of the end 12. Outer and inner walls engage about the upper end region 13 of the side wall 14. The inner wall 12a of the end 12 of the pressure connection element 8 facing the base body 2 is designed with a length such that it covers a flow stop edge 16 formed on the inner side 15 of the side wall 14 of the base body. This structure enables simultaneous filling of the inner space of the base body 2 and of the interspace between the side wall 14 and the pressure connection element 8 with filler 6. For the purpose of filling, the filler 6 is introduced through the opening in the pressure connection element 8, in this case a connector for a hose, into the inner space of the base body 2. The filling level is chosen such that the filler 6 can penetrate from below into the gap between the inner wall 15 of the chip carrier 3 and the inner end 12a of the pressure connection element 8. The filler is drawn up further in this gap by capillary forces, surmounts the flow stop edge 16 in the process, which edge would limit the flow of the filler 6 if there were no pressure connection element 8 emplaced, and virtually completely fills the interspace between pressure connection element 8 and base body side wall 14. In this way, it is possible to carry out the filling of the inner space of the base body 2 and the sealing between pressure connection element 8 and base body 2 in one step. An additional sealing step is not necessary. The base body and the pressure connection element are preferably fixedly connected to one another beforehand by means of adhesive bonding, welding or mutual engagement (clamping).

Figure 3:
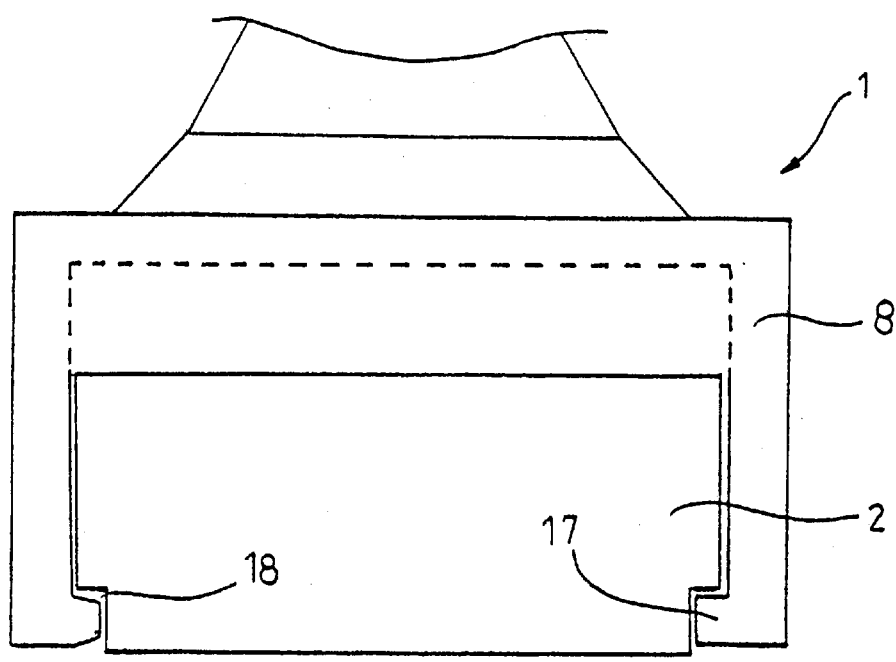
FIG. 3 is a diagrammatic sectional view of a further embodiment of the pressure sensor component according to the invention.

The pressure connection element can be fastened particularly securely if it is provided with two or more fastening lugs which engage in corresponding fastening openings or cutouts in the base body. This is illustrated by way of example in FIG. 3, which diagrammatically shows a cross section through one possible embodiment of a pressure sensor component according to the invention. The base body 2 and the pressure connection element 8 are represented in a greatly simplified manner, since the intention is to illustrate merely one possible arrangement of fastening lugs and openings. The cross-sectional axis is rotated through 90° relative to that in FIG. 1.

In its lower end-side region, the pressure connection element 8 has two fastening lugs 17, which project in the direction of the base body 2. In the lower edge region of the base body, fastening cutouts 18 are present on two opposite outer sides, in which cutouts the fastening lugs 17 engage in the assembled pressure sensor component according to the invention. In order to facilitate the engagement, those sides of the fastening lugs which face the fastening cutouts may be rounded or beveled, as is illustrated using the example of the fastening lug on the left in FIG. 3. The fastening lugs 17 can extend over the entire length of the side walls of the base body or just over a greater or lesser partial region of said side walls. In the latter case, the fastening lugs prevent the pressure connection element not only from lifting off from the base body but also from slipping laterally. In this case, too, the pressure connection element and the base body are sealed in the manner described above.

Figure 4:
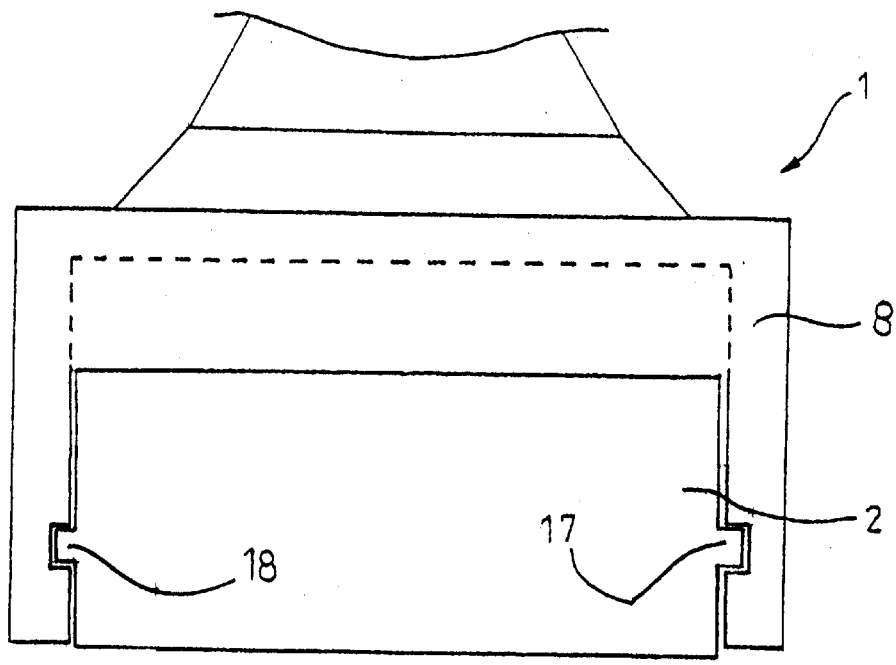
FIG. 4 is a similar view of an alternative of the further embodiment of the pressure sensor.

FIG. 4 illustrates an alternative in which the cutouts are formed in the walls of the pressure connection element 8 and the side walls of the base body 2 are formed with the lugs 17 and 18.

I claim:

1. A pressure sensor component for mounting on a component-mounting surface of a printed circuit board, the component comprising:

a base body formed with a chip carrier and a semiconductor chip mounted on said chip carrier;

a flowable filler completely covering said base body;

a plurality of electrical connections to be routed out from said base body;

a tubular pressure connection element having an end fastened on said base body, said flowable filler filling interspaces formed between said end of said pressure connection element and said base body at least partially and sealing said pressure connection element gastightly against said base body.

2. The pressure sensor component according to claim 1, wherein said pressure connection element is fastened on said base body by an attachment selected from the group consisting of adhesive bonding, welding, and clamping.

3. The pressure sensor component according to claim 1, wherein said base body has a side wall encompassing said chip carrier and said semiconductor chip and forming an end region projecting towards said pressure connection element, said end of said pressure connection element engaging on both sides about said end region of said side wall, and wherein said base body and said pressure connection element are sealed against one another with said flowable filler.

4. The pressure sensor component according to claim 2, wherein said side wall is formed with a flow stop edge for said filler, and said end of said pressure connection element facing said base body has an inner wall extending along an inside of said side wall of said base body for covering said flow stop edge peripherally inside said inner wall.

5. The pressure sensor component according to claim 1, wherein said pressure connection element is formed with at least one fastening lug adapted to engage in an associated fastening recess formed in said base body.

6. The pressure sensor component according to claim 1, wherein said fastening recess is one of a fastening cutout and a fastening opening in said base body.

7. The pressure sensor component according to claim 1, wherein said base body has at least one fastening lug formed thereon adapted to engage in an associated fastening recess formed in said pressure connection element.

8. The pressure sensor component according to claim 1, wherein said pressure connection element is formed with a conical connector for attachment of hoses of respectively different diameters.

9. The pressure sensor component according to claim 1, wherein said flowable filler is a gel.

10. The pressure sensor component according to claim 1, wherein said flowable filler is a silicone resin-based gel.

* * * * *